(12) United States Patent
Howder et al.

(10) Patent No.: US 11,335,694 B2
(45) Date of Patent: May 17, 2022

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Collin Howder, Meridian, ID (US); Chet E. Carter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 16/702,255

(22) Filed: Dec. 3, 2019

(65) Prior Publication Data

US 2021/0167082 A1    Jun. 3, 2021

(51) Int. Cl.
| | | |
|---|---|---|
| H01L 27/11582 | (2017.01) | |
| H01L 27/1157 | (2017.01) | |
| H01L 27/11556 | (2017.01) | |
| H01L 27/11524 | (2017.01) | |
| H01L 21/822 | (2006.01) | |

(52) U.S. Cl.
CPC .... H01L 27/11582 (2013.01); H01L 21/8221 (2013.01); H01L 27/1157 (2013.01); H01L 27/11524 (2013.01); H01L 27/11556 (2013.01)

(58) Field of Classification Search
CPC ........... H01L 21/8221; H01L 27/11582; H01L 27/1157; H01L 27/11556; H01L 27/11524; H01L 27/11551
See application file for complete search history.

(56) References Cited

U.S. PATENT DOCUMENTS

| | | |
|---|---|---|
| 9,881,929 B1 | 1/2018 | Ravikirthi et al. |
| 10,236,301 B1 | 3/2019 | Howder et al. |
| 10,276,583 B2 | 4/2019 | Sharangpani et al. |
| | (Continued) | |

FOREIGN PATENT DOCUMENTS

WO    WO 2017/058299    4/2017

OTHER PUBLICATIONS

Okinaka et al., "Electroless Plating of Platinum Group Metals", Chapter 16 of Electroless plating: fundamentals and applications, Eds. Mallory et al., 1990, United Kingdom, pp. 421-440.

(Continued)

*Primary Examiner* — Phat X Cao
(74) *Attorney, Agent, or Firm* — Wells St. John P.S.

(57) ABSTRACT

A method used in forming a memory array comprises forming a substrate comprising a conductor tier comprising an upper conductor material and a lower conductor material, and a stack comprising vertically-alternating first tiers and second tiers above the conductor tier. Horizontally-elongated trenches are formed through the stack to the upper conductor material and the lower conductor material. At least one of the upper and lower conductor materials have an exposed catalytic surface in the trenches. Metal material is electrolessly deposited onto the catalytic surface to cover the upper conductor material and the lower conductor material within the trenches. Channel-material strings of memory cells are formed and extend through the second tiers and the first tiers. Other embodiments, including structure independent of method, are disclosed.

8 Claims, 15 Drawing Sheets

(56) References Cited

U.S. PATENT DOCUMENTS

| | | |
|---|---|---|
| 10,388,665 B1 | 8/2019 | Xie et al. |
| 2011/0151633 A1 | 6/2011 | Park et al. |
| 2012/0256289 A1 | 10/2012 | Borsari et al. |
| 2013/0178066 A1 | 7/2013 | Cho et al. |
| 2014/0014889 A1 | 1/2014 | Shim et al. |
| 2014/0239303 A1 | 8/2014 | Zhu et al. |
| 2015/0008502 A1 | 1/2015 | Chien et al. |
| 2015/0318301 A1 | 11/2015 | Lee et al. |
| 2016/0071861 A1 | 3/2016 | Serov et al. |
| 2016/0093538 A1 | 3/2016 | Wakatsuki et al. |
| 2016/0093634 A1 | 3/2016 | Jang et al. |
| 2016/0268302 A1 | 9/2016 | Lee et al. |
| 2016/0276359 A1* | 9/2016 | Oginoe ............ H01L 27/11556 |
| 2017/0092654 A1 | 3/2017 | Nishikawa et al. |
| 2017/0148811 A1* | 5/2017 | Zhang ............... H01L 27/11519 |
| 2017/0207226 A1* | 7/2017 | Lee ................... H01L 27/11573 |
| 2017/0278859 A1 | 9/2017 | Sharangpani et al. |
| 2018/0102375 A1 | 4/2018 | Pang et al. |
| 2018/0261671 A1 | 9/2018 | Matsumoto et al. |
| 2019/0157294 A1 | 5/2019 | Kanamori et al. |
| 2019/0287982 A1 | 9/2019 | Hinoue et al. |
| 2019/0311756 A1 | 10/2019 | Sharma et al. |
| 2020/0105782 A1 | 4/2020 | Guo et al. |
| 2020/0235112 A1 | 7/2020 | Howder et al. |
| 2020/0402993 A1* | 12/2020 | Hopkins ........... H01L 29/66545 |

OTHER PUBLICATIONS

U.S. Appl. No. 16/251,241, filed Jan. 18, 2019, by Howder et al.
U.S. Appl. No. 16/445,065, filed Jun. 18, 2019, by Hopkins et al.
U.S. Appl. No. 16/449,912, filed Jun. 24, 2019, by Howder et al.
U.S. Appl. No. 17/070,269, filed Oct. 14, 2020 by Howder et al.
U.S. Appl. No. 16/653,062, filed Oct. 15, 2019, by Smith et al.
U.S. Appl. No. 16/787,914, filed Feb. 11, 2020, by Howder et al.

* cited by examiner

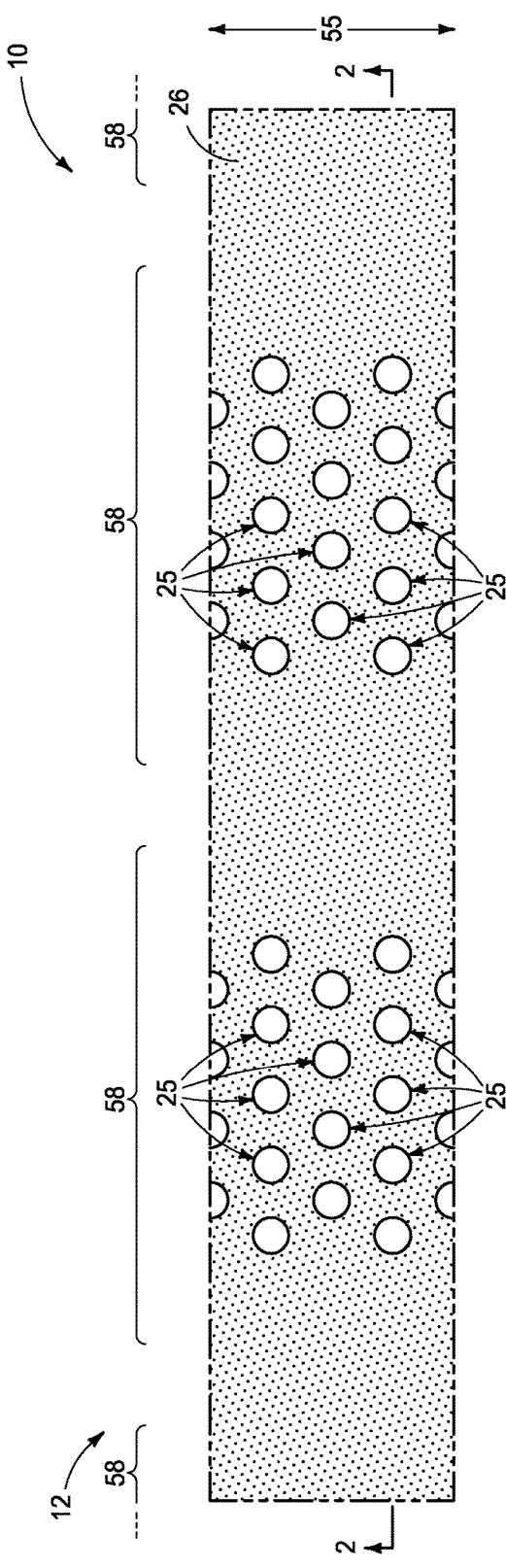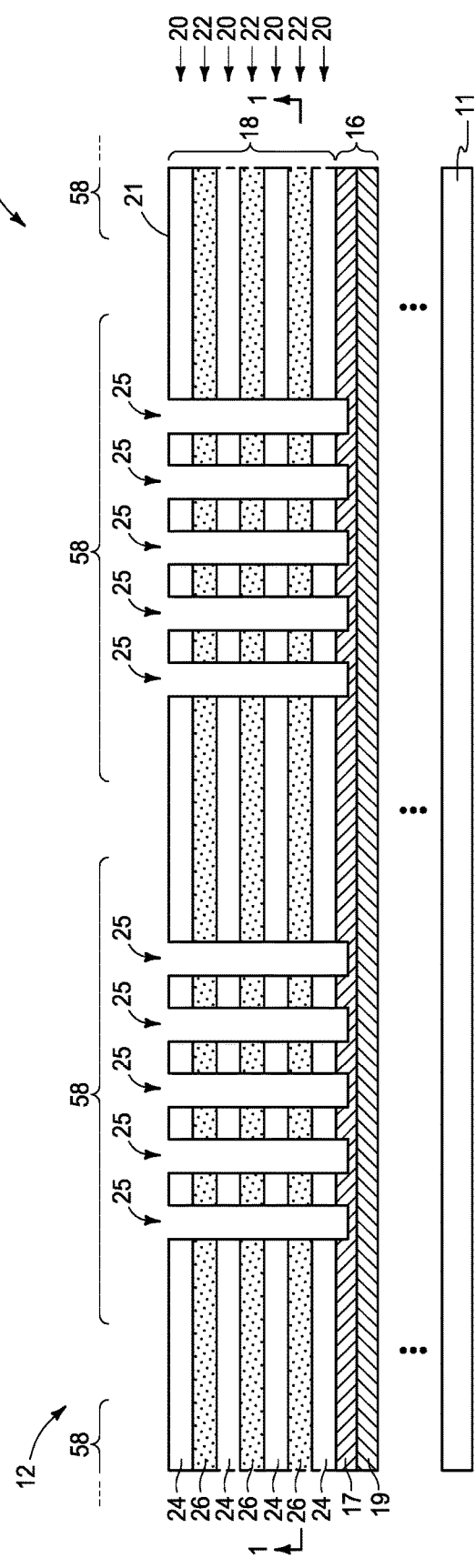

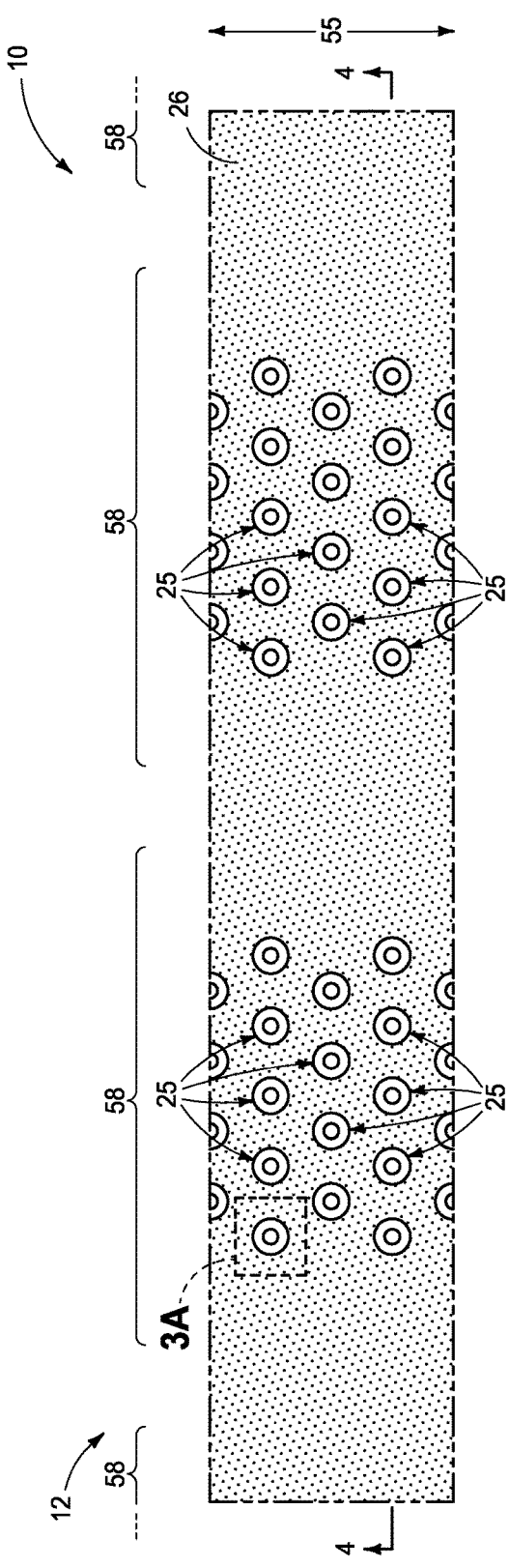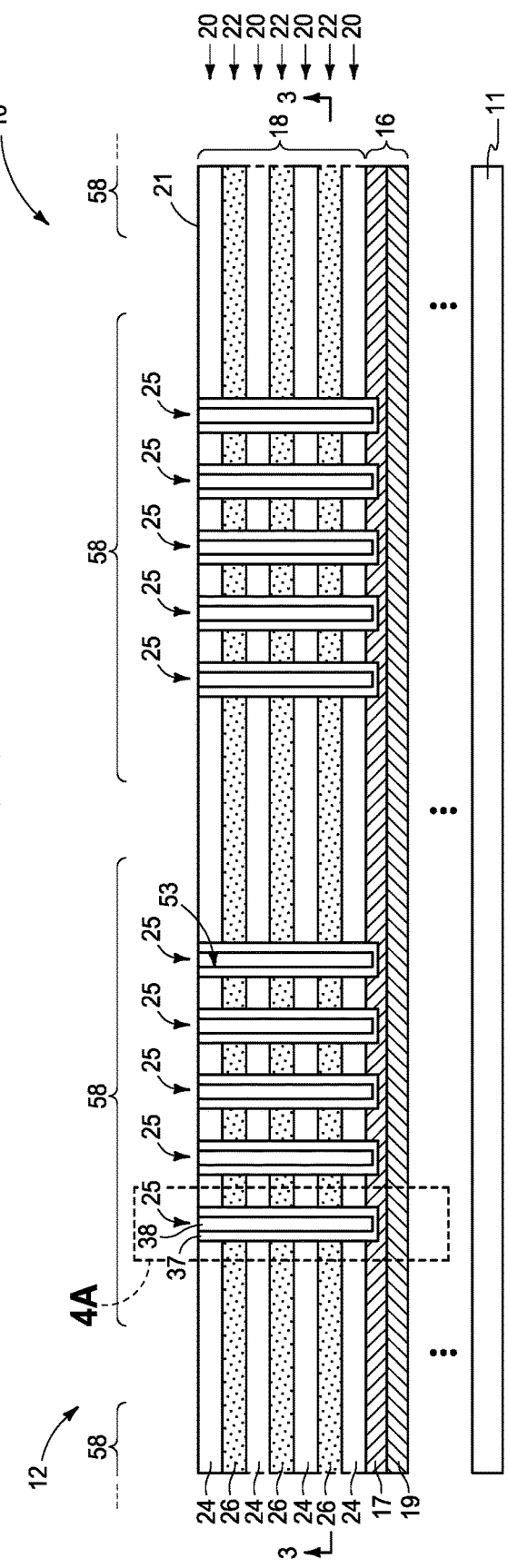
FIG. 3
FIG. 4

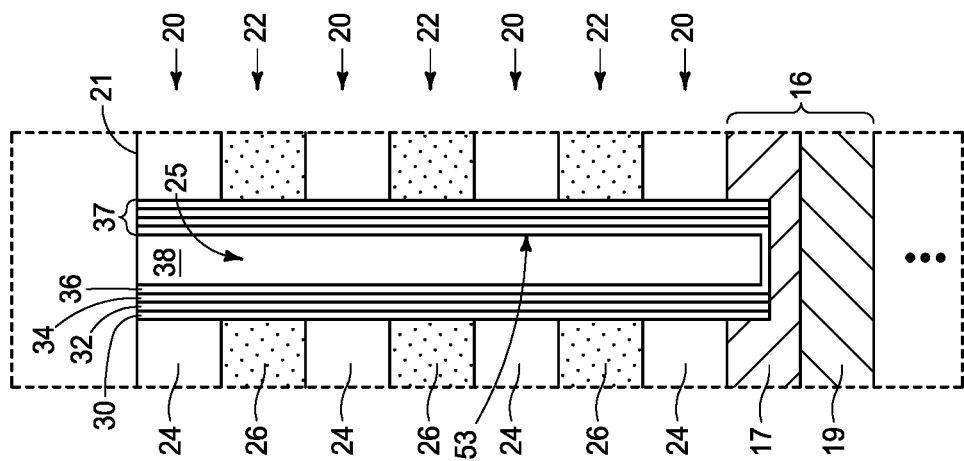
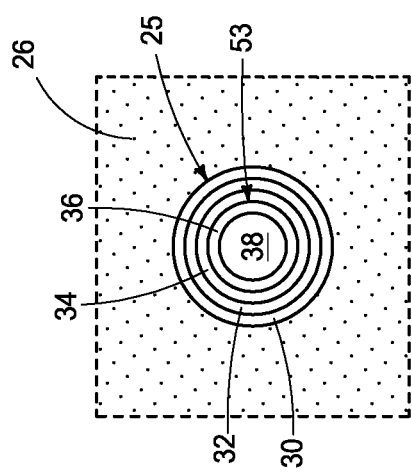

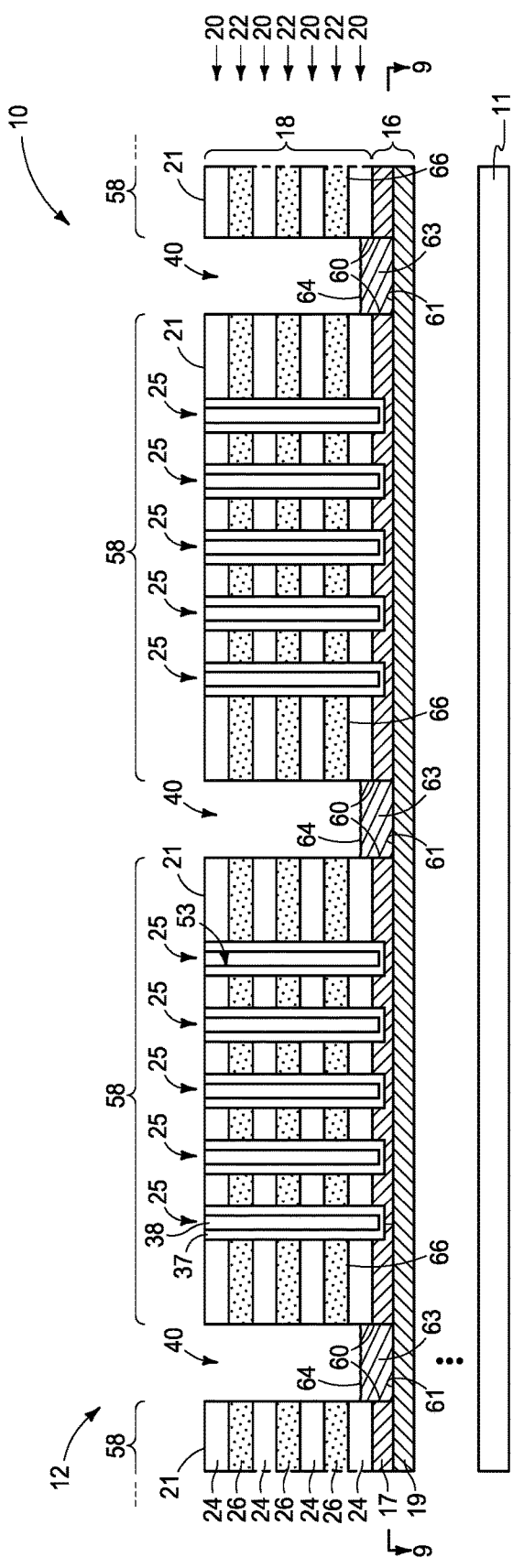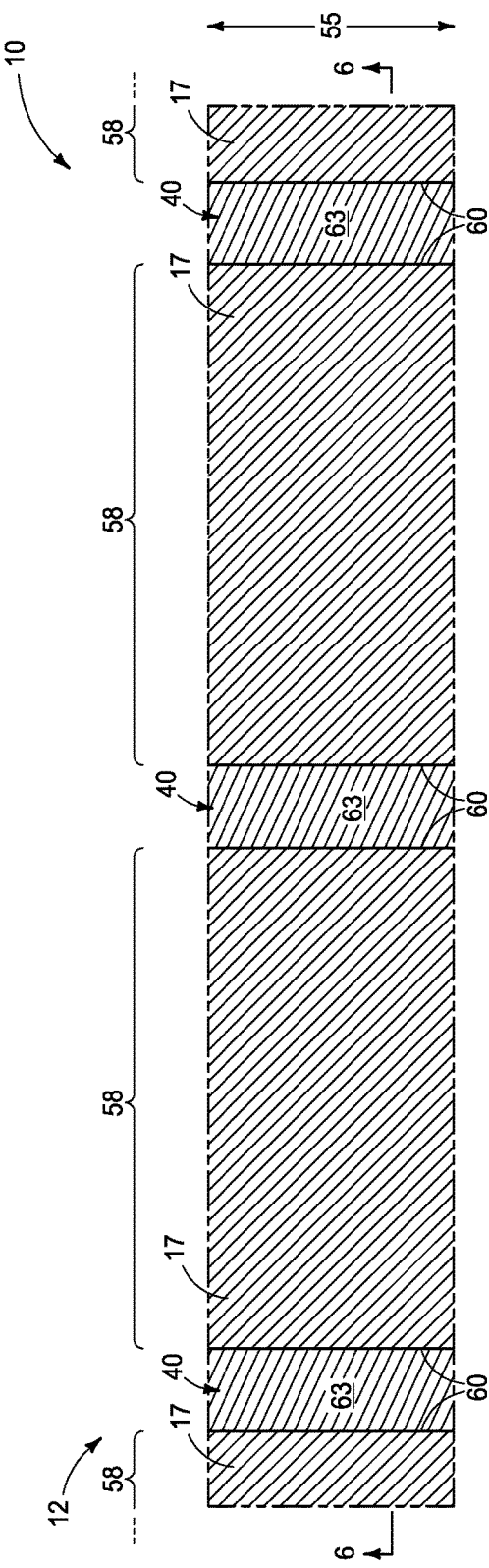

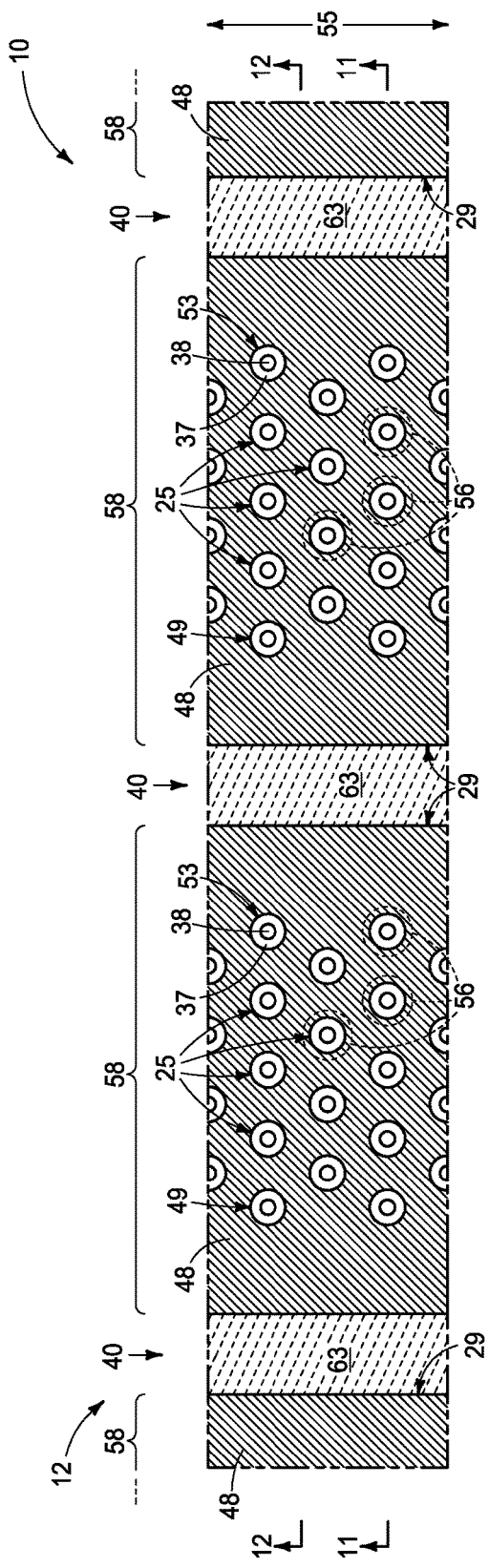
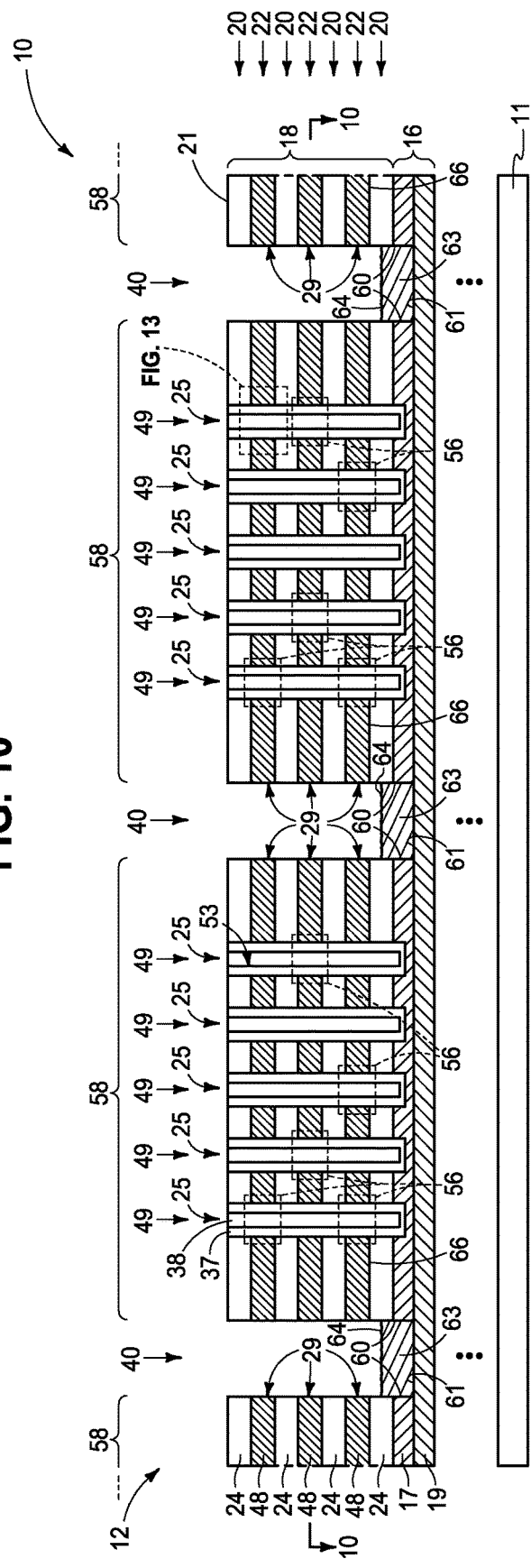

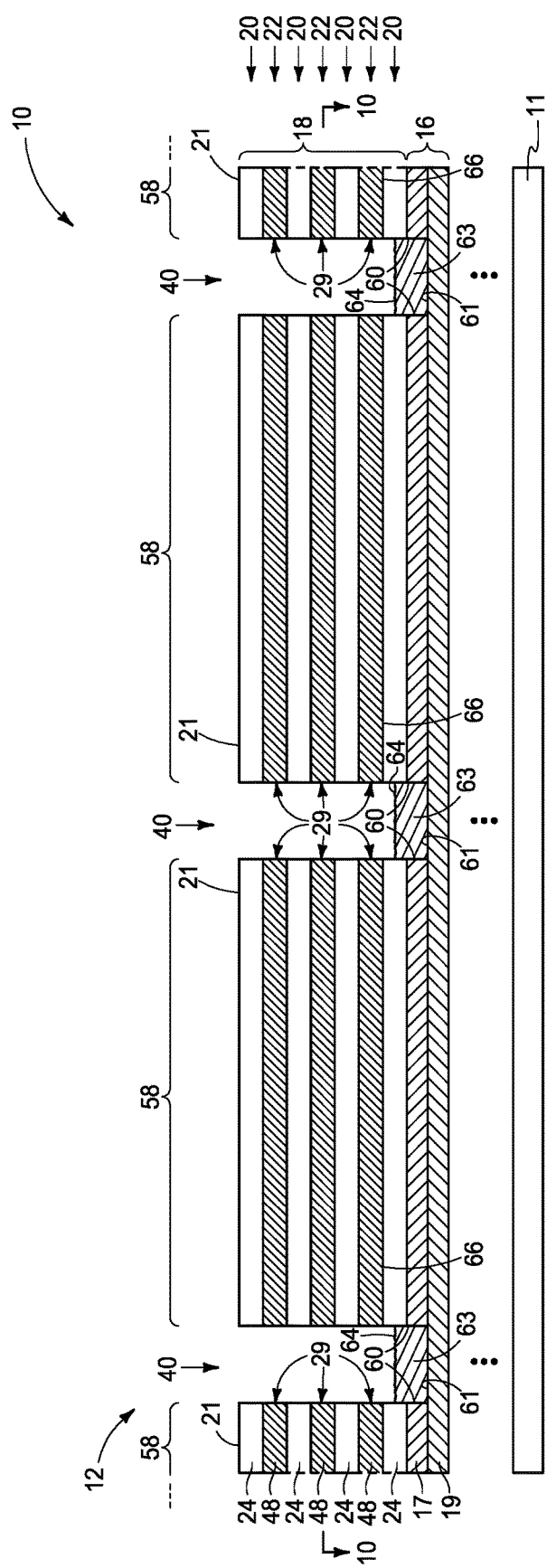
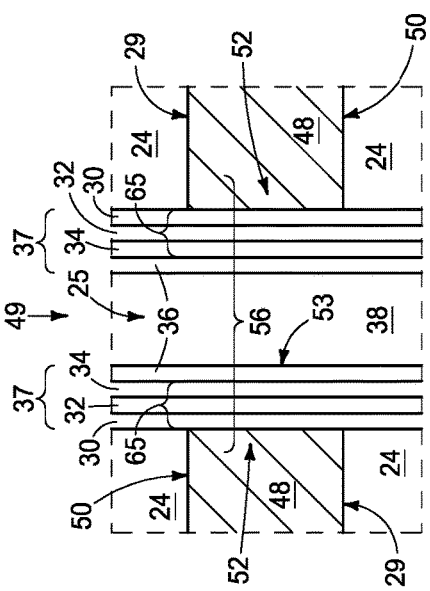
FIG. 12
FIG. 13

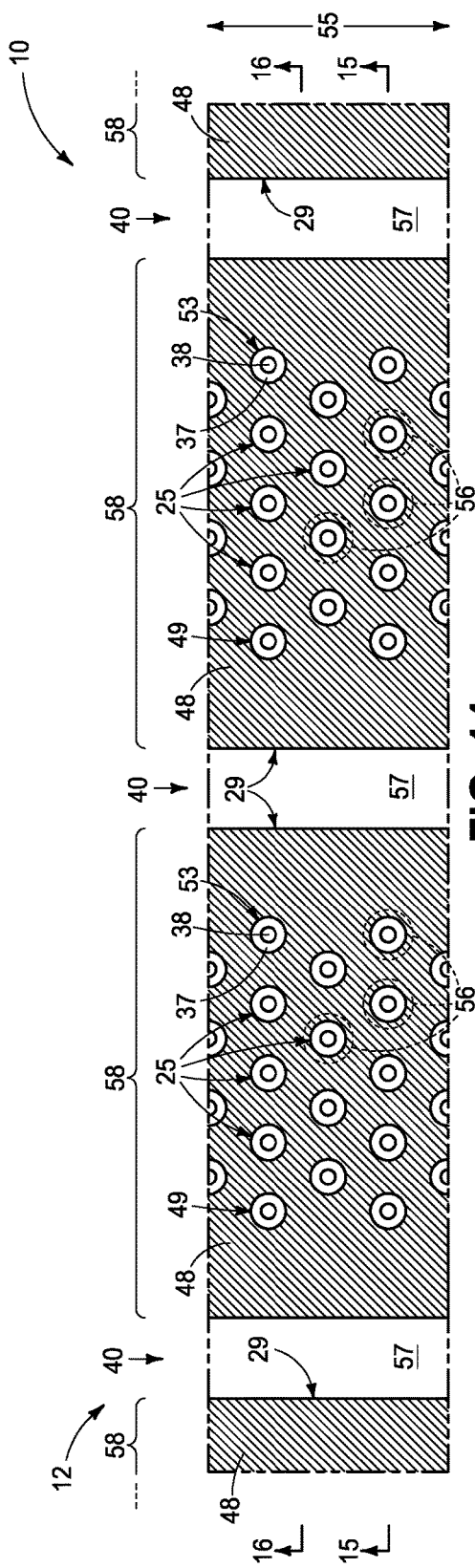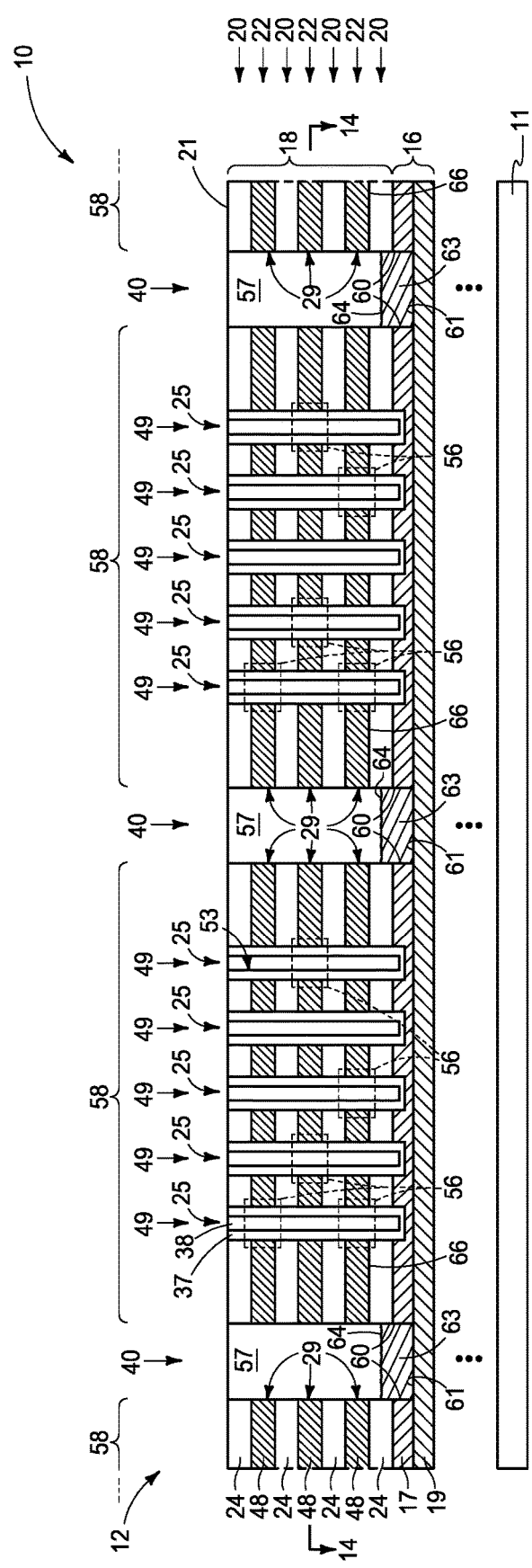

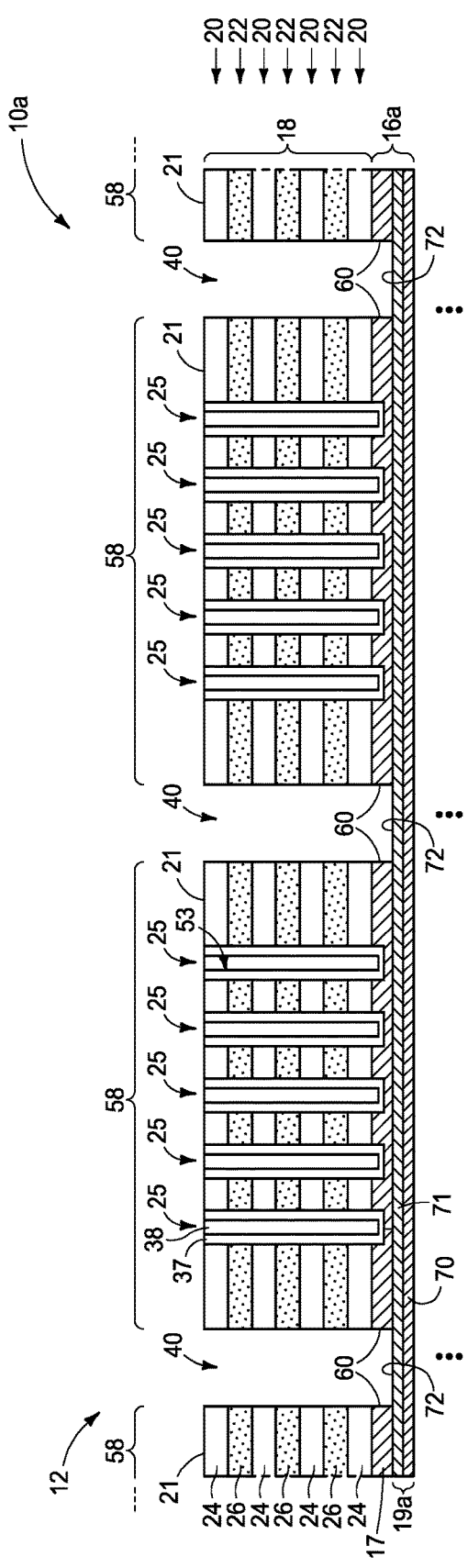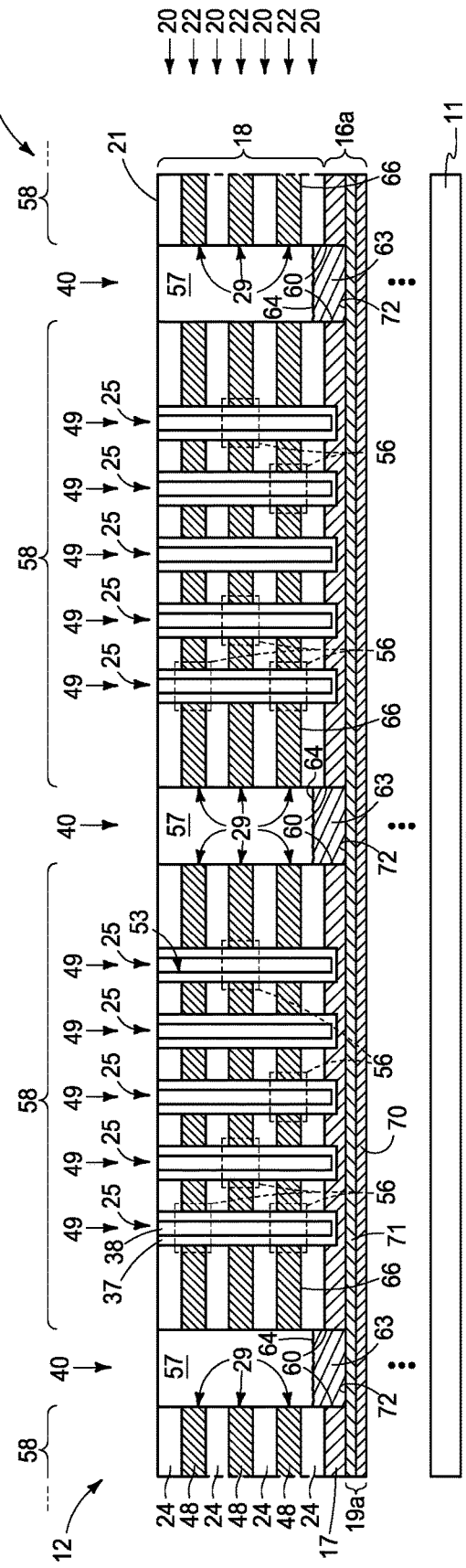

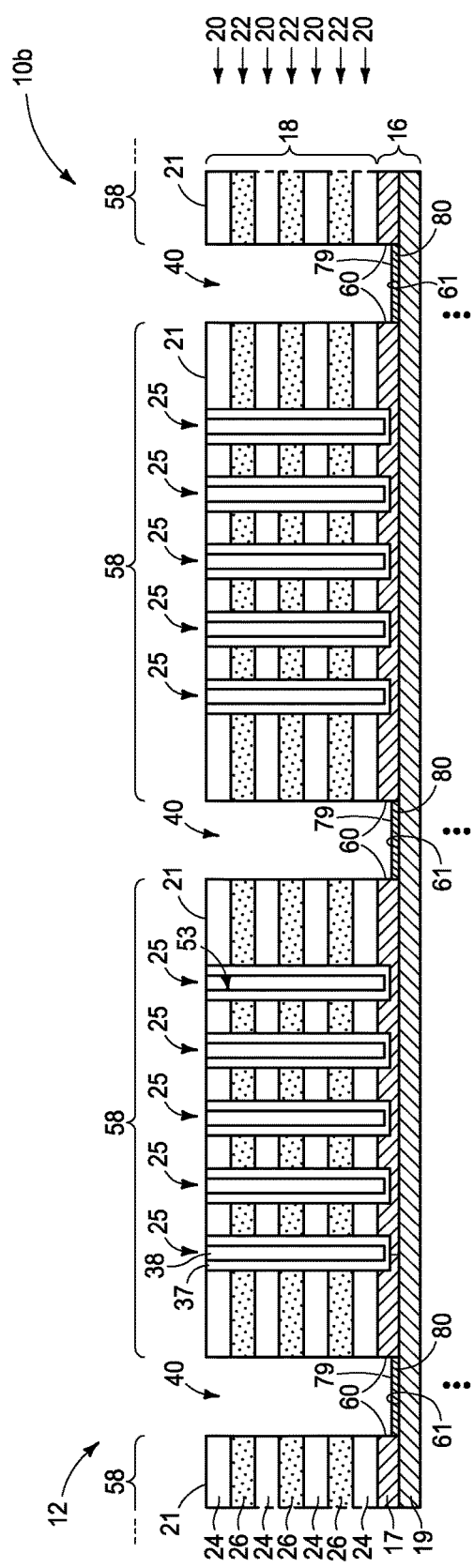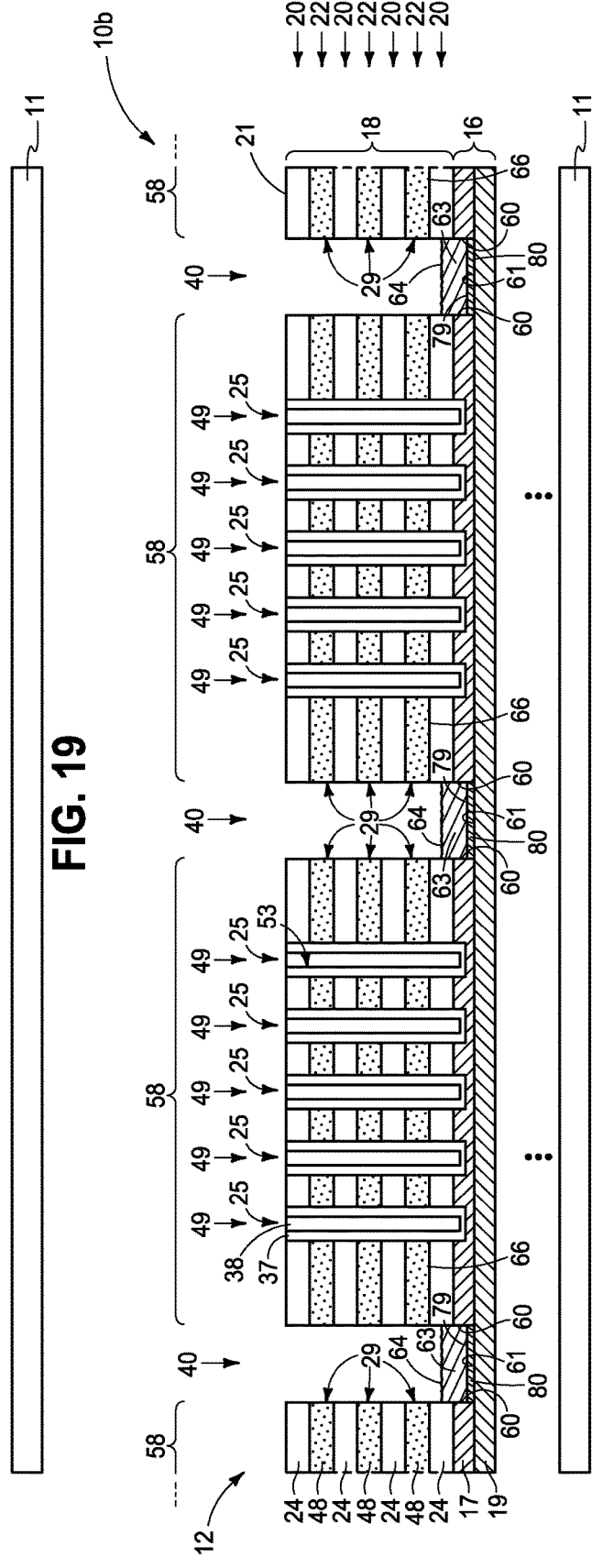

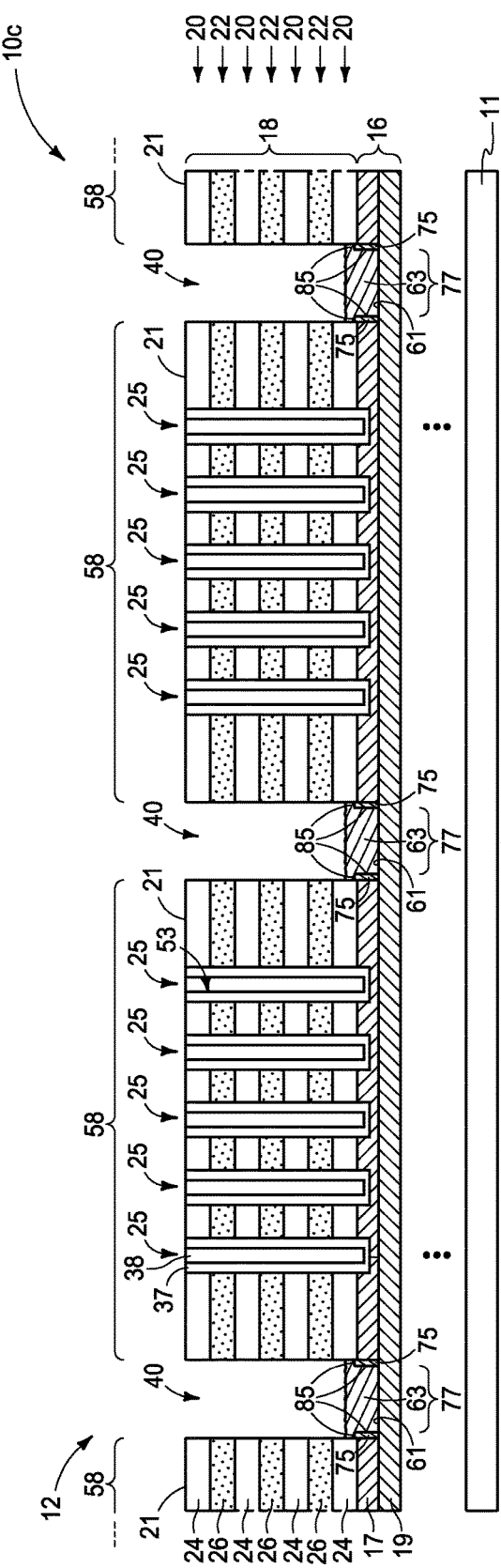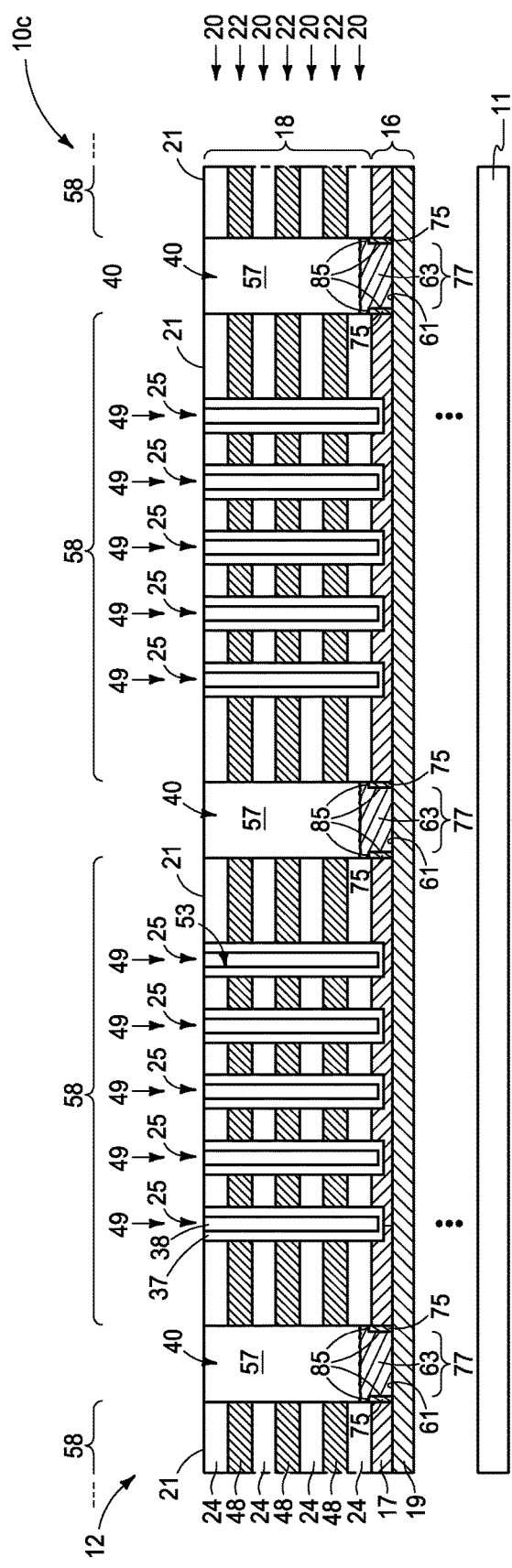

MEMORY ARRAYS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Materials of this other circuitry may undesirably be etched when etching material there-above. For example, such other circuitry may comprise a silicide that is under conductively-doped polysilicon. A vertical stack above the conductively-doped polysilicon may be patterned by etching trenches through the stack and conductively-doped polysilicon to the silicide. This may lead to undesired lateral etching of the polysilicon upon exposure of the silicide due to galvanic reaction/corrosion either during the trench etching or during subsequent etching. Such may lead to failed circuitry.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3, 3A, 4, 4A, and 5-16 are diagrammatic sequential sectional and/or enlarged views of the construction of FIGS. 1 and 2, or portions thereof, in process in accordance with some embodiments of the invention.

FIGS. 17-25 are diagrammatic cross-sectional views of a portion of substrate in accordance with embodiments of the invention and/or in process in accordance with the invention.

DETAILED DESCRIPTION OF EXAMPLE EMBODIMENTS

Figure 5:
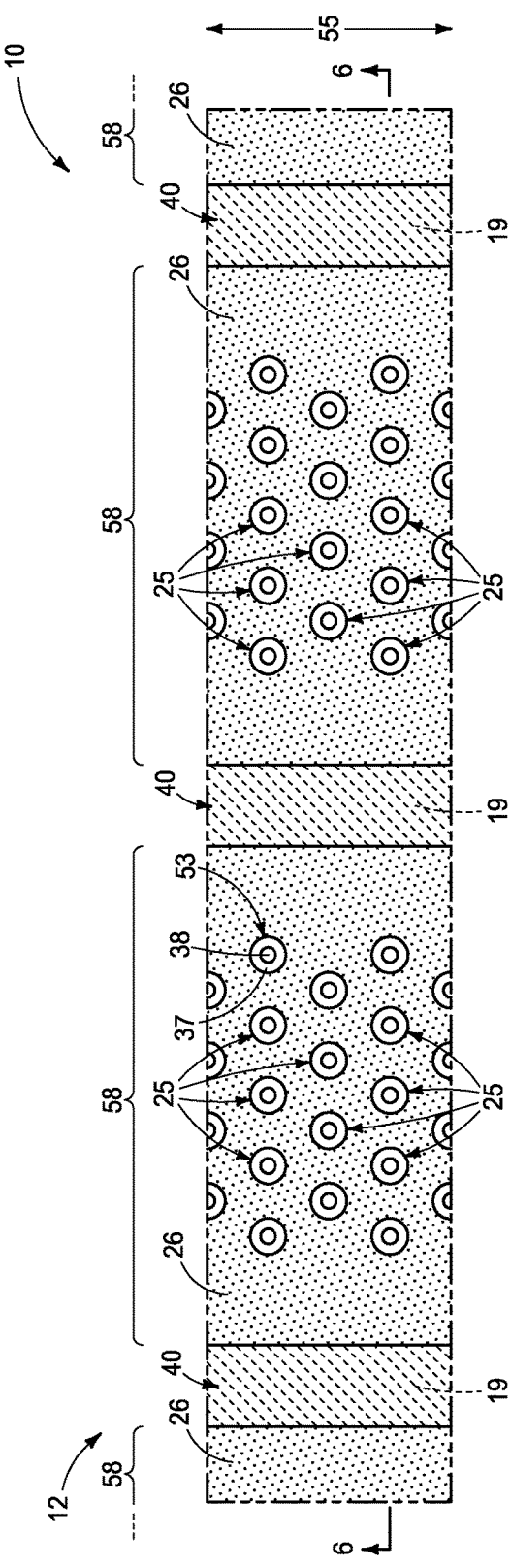

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-20 which may be considered as a "gate-last" or "replacement-gate" process.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising an upper conductor material 17 and a lower (positionally) conductor tier 19 has been formed above substrate 11. Conductor tier 16 may comprise part of control circuitry (e.g., peripheral-under-array circuitry and/or a common source line or plate) used to control read and write access to the transistors and/or memory cells that will be formed within array 12. In one embodiment, lower conductor material comprises a silicide (e.g., tungsten silicide) and upper conductor material 17 comprised conductively-doped semiconductive material (e.g., conductively-doped polysilicon). Conductor tier 19 may comprise more materials acid/or layers (not shown in FIG. 2).

A stack 18 comprising vertically-alternating insulative tiers 20 and conductive tiers 22 has been formed above conductor tier 16. Example thickness for each of tiers/materials 17, 19, 20, and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Uppermost insulative tier 20 may be considered as having a top surface 21.

Channel openings 25 have been formed (e.g., by etching) through insulative tiers 20 and conductive tiers 22 to conductor tier 16. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. Memory-block regions 58 and resultant memory blocks 58 (not yet shown) may be considered as being horizontally longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3, 3A, 4, and 4A show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop/within upper portions of channel material strings 53 for better conductive connection to overlying circuitry (not shown).

Figure 6:
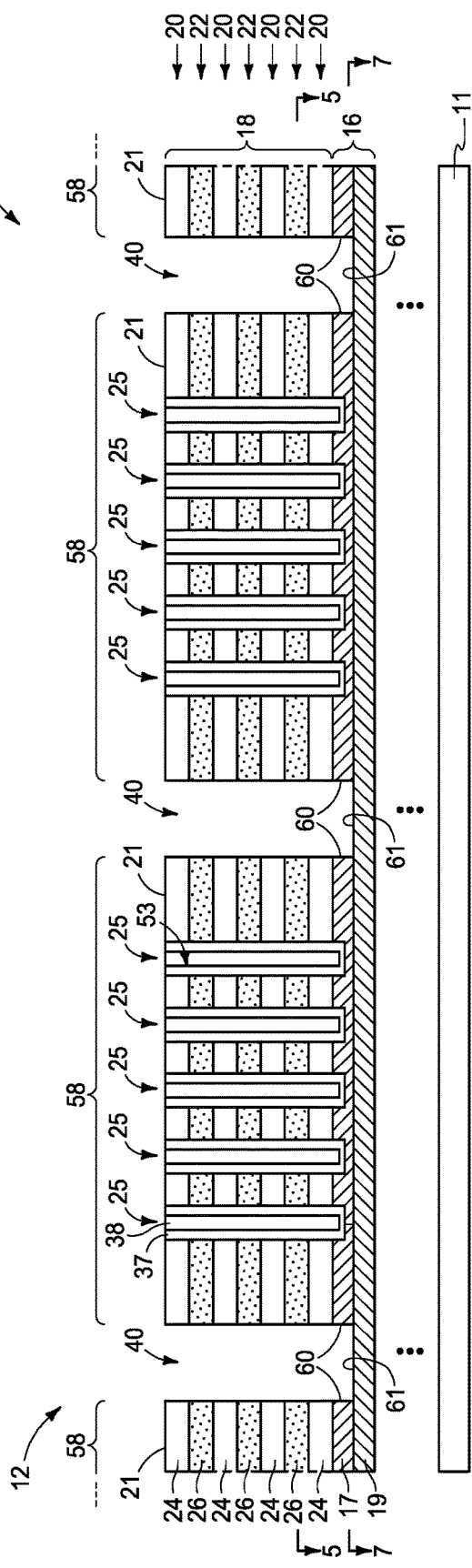
Figure 7:
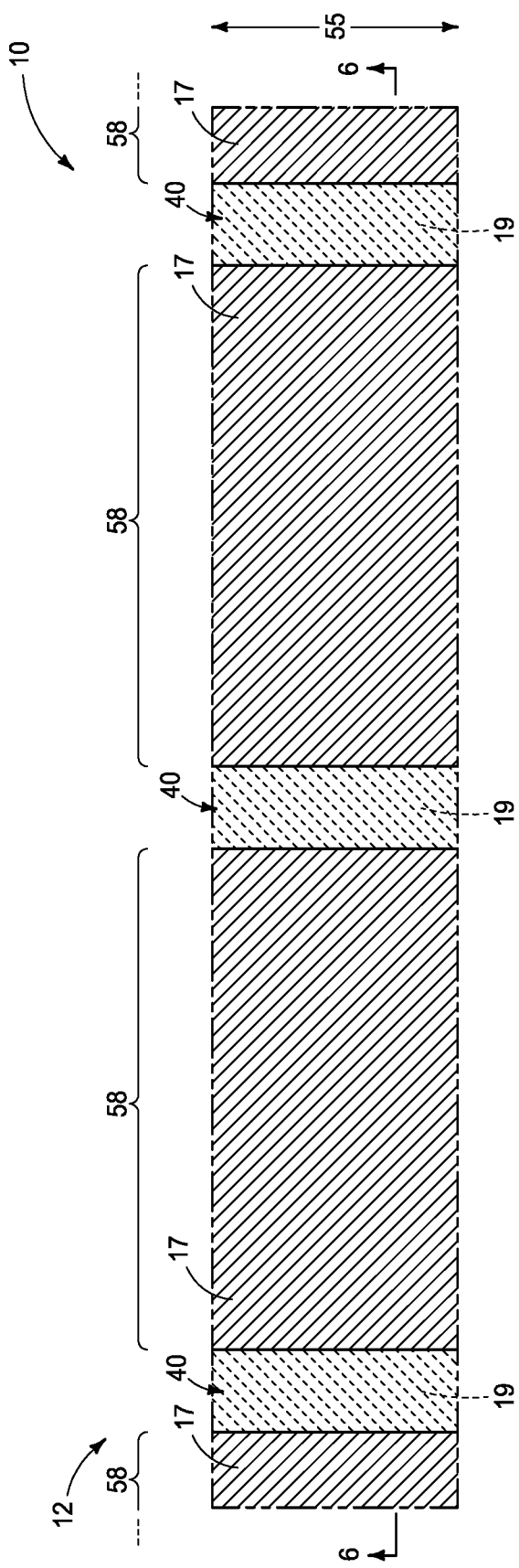

Referring to FIGS. 5-7, horizontally-elongated trenches 40 have been formed (e.g., by anisotropic etching) through stack 18 to upper conductor material 17 and to lower conductor material 19 to form laterally-spaced memory-block regions 58. Trenches 40 as shown may have individual bottoms that are atop lower conductor material 19. Alternately, trenches 40 may have individual bottoms that are within (i.e., between top and bottom of) lower conductor material 19 or below lower conductor material 19 (neither being shown). Upper conductor material 17 has an exposed surface 60 in trenches 40 and lower conductor material 19 has an exposed surface 61 in trenches 40. If trenches 40 are etched into lower conductor material 19 (not shown), exposed surface 61 will include sidewalls thereof (not shown).

The above processing shows forming and filling channel openings 25 prior to forming trenches 40. Such could be reversed. Alternately, trenches 40 could be formed in between the forming and filling of channel openings 25 (not ideal).

At least one of the upper and lower conductor materials ultimately has an exposed catalytic surface (i.e., "catalytic" and "non-catalytic" herein being in the context of electroless deposition) in trenches 40. By way of examples only, example catalytic surfaces comprise at least one of Ti, Ni, W, Co, Cu, Mo, Au, and Pd. In one embodiment, only one of the upper and lower conductor materials has the exposed catalytic surface and in another embodiment both of the upper and lower conductor materials have the exposed catalytic surface. In one embodiment, the at least one of the upper and lower conductor materials intrinsically as-initially-formed comprises catalytic material of the catalytic surface. For example, and by way of example only, one and/or both of materials 17 and 19 could comprise Ti, Ni, W, Co, Cu, Mo, Au, and Pd intrinsically as-initially-formed whereby one or both of exposed surfaces 60 and 61 is a catalytic surface. Yet in some embodiments, at least one of the upper and lower conductor materials intrinsically as-initially-formed does not comprise catalytic material of the catalytic surface. For example, and by way of example only, neither of conductively-doped semiconductive material nor tungsten silicide is intrinsically catalytic material for electroless deposition. Accordingly, and by way of example only, one of materials 17 and 19 could be at least one of Ti, Ni, W, Co, Cu, Mo, Au, and Pd and the other could be at least one of semiconductively-doped semiconductive material and tungsten silicide. In one embodiment, the lower conductor material intrinsically as-initially-formed comprises the catalytic material of the catalytic surface, and in one such embodiment only the lower conductor material comprises such intrinsically as-initially-formed catalytic material.

Referring to FIGS. 8 and 9, metal material 63 has been electrolessly deposited onto the catalytic surface (e.g., one or both of surfaces 60 and 61 depending on whether such is/are catalytic) to cover upper conductor material 17 and lower conductor material 19 within trenches 40. Accordingly, if one of surfaces 60 or 61 is non-catalytic, electroless deposition from the other catalytic surface 60 or 61 is conducted to a degree sufficient to cover such one surface, regardless. In one embodiment and as shown, metal material 63 spans (i.e., completely) laterally-between immediately-laterally-adjacent memory blocks 58. The electrolessly deposited metal material 63 may be of the same composition as or of different composition from that of the catalytic surface, and may comprise an alloy, for example at least one of CoWP, NiWP, and NiB. In one embodiment, the electrolessly depositing forms metal material 63 to have a top 64 that is below a bottom 66 of a lowest of conductive tiers 22. Alternately, and by way of example only, the electroless depositing may form the metal material 63 to have its top 64 above bottom 66 of lowest conductive tier 22 (not shown) and then further comprising vertically recessing metal material 63 after the electrolessly depositing to move top 64 to below bottom 66 to preclude the shorting of lowest conductive tier 22 to conductor tier 16. The artisan is capable of determining and using any existing or future-developed electroless deposition for forming metal material 63. For example, and by way of examples only, copper can be electrolessly deposited onto copper (the catalytic surface in this example) using an aqueous solution at pH 12.5 containing cupric sulfate, ethylenediaminetetraacetic acid, formaldehyde, and sodium hydroxide. Nickel can be electrolessly deposited onto nickel (the catalytic surface in this example) using an aqueous solution at pH 7.0 containing nickel sulfate, sodium citrate, lactic acid, dimethylamine borane, and ammonium hydroxide. Co(P) can be electrolessly deposited onto a suitable catalytic surface using an aqueous solution at pH 8.0 containing sulfamic acid, sodium sulfate, boric acid, sodium hydroxide, cobalt sulfate, and sodium hypophosphate. In some embodiments, material 63 may be considered as or referred to as horizontally-elongated conductor material 63 that is directly electrically coupled to conductor tier 16.

Referring to FIGS. 10-13, and in one embodiment, material 26 (not shown) of conductive tiers 22 has been removed, for example by being isotropically etched away through trenches 40 ideally selectively relative to the other exposed materials (e.g., insulative tiers 20) (e.g., using liquid or vapor $H_3PO_4$ as a primary etchant where material 26 is silicon nitride, and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 13 and some with dashed outlines in FIGS. 10 and 11, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 13) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel-material strings 53. Alternately, the conducting material of the conductive tiers may be formed before trenches 40 and/or before forming channel openings 25 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conducting material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 16:
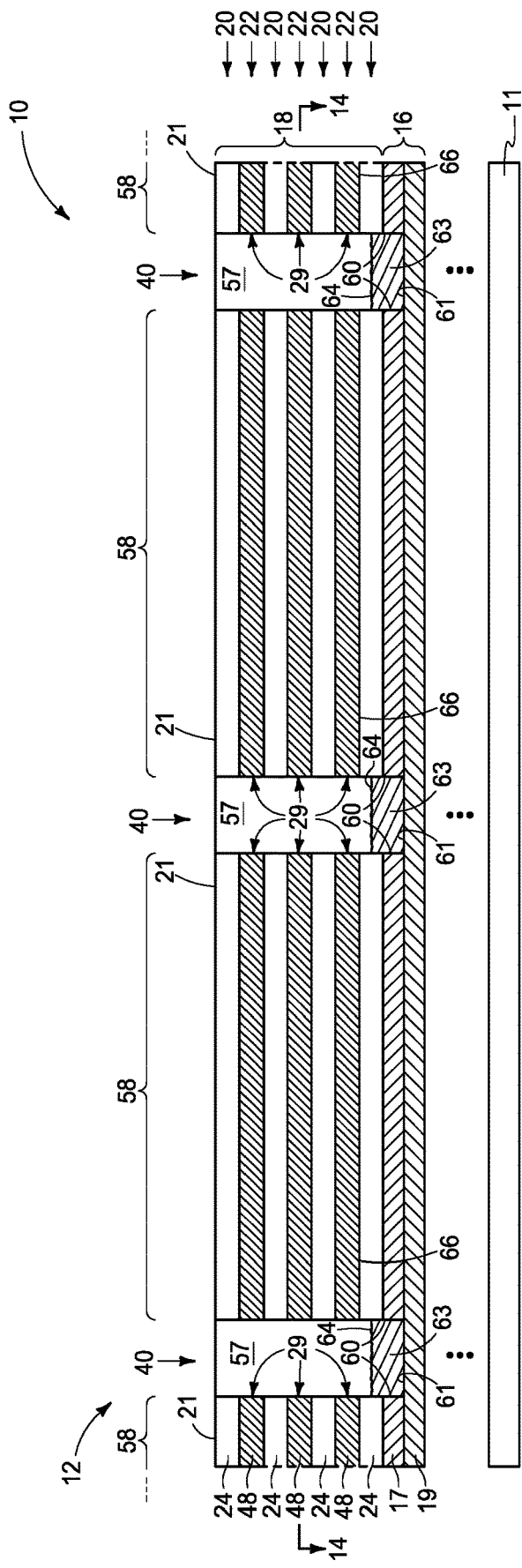

Referring to FIGS. 14-16, intervening material 57 has been formed in horizontally-elongated trenches 40 above metal material 63. Intervening material 57 may provide lateral electrical isolation (insulation) between immediately-laterally-adjacent memory-block regions 58 and ultimate memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In one embodiment, intervening material 57 comprises a laterally-outermost insulative material (e.g., silicon dioxide and not shown) and a laterally-inner material (e.g., undoped polysilicon and not shown) of different composition from that of the laterally-outermost insulative material. In one such embodiment, the laterally-inner material is insulative. In one embodiment, intervening material 57 is everywhere insulative between the immediately-laterally-adjacent memory blocks. In some embodiments, material 57 and metal material 63 may in combination be considered as intervening material that is laterally-between immediately-adjacent memory blocks 58.

In some method embodiments, some or all of metal material 63 is removed (not shown) prior to forming intervening material 57. Alternately, at least some metal material 63 may remain in a finished construction of the memory array (as shown).

Some aspects of the invention were motivated in preventing a galvanic reaction in a certain etching chemistry when both polysilicon and tungsten silicide are simultaneously exposed thereto. Specifically, in "replacement-gate" processing and in a specific example as described above, sacrificial material 26 is silicon nitride which is etched away with $H_3PO_4$ and that can cause such undesired galvanic reaction. Other materials and chemistries may not cause the galvanic reaction or if such do/does, the galvanic reaction may not be to a degree that may destroy the circuitry being fabricated. Accordingly, and regardless of what may have motivated the invention, the electroless deposition might be conducted after the replacement-gate processing exemplified by FIGS. 10-13. Further, as stated above, "gate-first" processing may alternately be used and metal material 63 formed at any suitable time after forming trenches 40.

Any other attribute(s) or aspect(s) as shown and/or described herein with respect to other embodiments may be used with respect to the above-described embodiments.

Additional example methods used in forming a memory array are next described with reference to FIGS. 17 and 18 with respect to an alternate construction 10*a*. Like numerals from the above-described embodiments have been used where appropriate, with some construction differences being indicated with a suffix "a" or with different numerals. Construction 10*a* in FIGS. 17 and 18 shows an alternate example construction and processing corresponding to those of FIGS. 6 and 15, respectively. Referring to FIG. 17, lower conductor material 19*a* of conductor tier 16*a* comprises a low (positionally) conductor material 70 and an intervening (positionally) conductor material 71 directly there-atop and directly against upper conductor tier 17. Intervening conductor material 71 comprises catalytic surface 72. Materials 70 and 71 may be as described above for materials 17 and 19, respectively. Trenches 40 may be formed to have individual bottoms that are atop or in intervening conductor material 71 (as shown) or that are atop or in lower conductor material tier 70 (not shown) or there-below (not shown). In one embodiment, intervening conductor material 71 intrinsically as-initially-formed comprises catalytic material of the catalytic surface. A resultant finished construction 10*b* is shown in FIG. 18. Any other attribute(s) or aspect(s) as shown and/or described herein with respect to other embodiments may be used.

Figure 21:
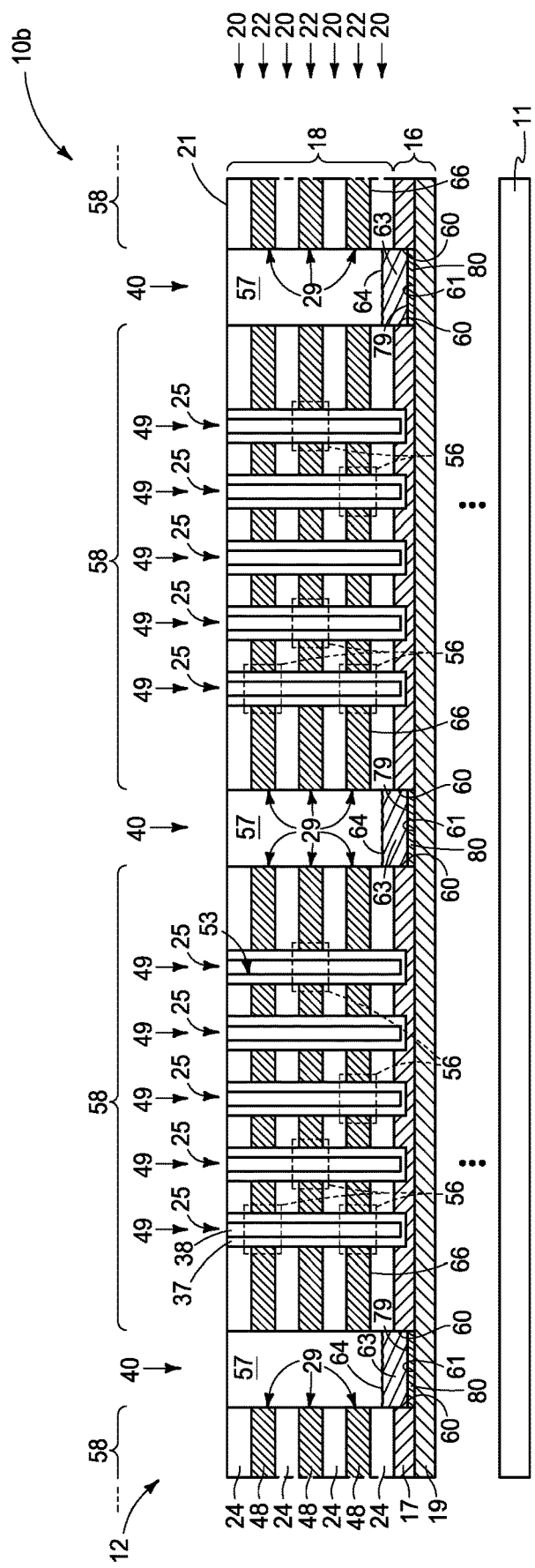

Additional example method embodiments used in forming a memory array are next described with reference to FIGS. 19-21 with respect to an alternate construction 10*b*. Like numerals from the above-described embodiments have been used where appropriate, with some construction differences being indicated with a suffix "b" or with different numerals. FIG. 19 may be considered as showing an example method embodiment wherein at least one of the upper and lower conductor materials intrinsically as-initially-formed does not comprise catalytic material of the catalytic surface. Accordingly, at least one of upper and lower conductor materials 17 and 19 has an exposed non-catalytic surface 60 and/or 61, respectively, in trenches 40. In one embodiment, both upper conductor material 17 and lower conductor material 19 have exposed non-catalytic surfaces (e.g., 60 and 61, respectively).

A catalytic surface is formed over the exposed non-catalytic surface in trenches 40 of the at least one of the upper and lower conductor materials. Such catalytic surface may be continuous over the exposed non-catalytic surface(s) or discontinuous there-over. Any existing or future-developed technique may be used to form such catalytic surface, including, for example, deposition of another material there-over or treatment of a non-catalytic surface to render it catalytic (e.g., by known or future-developed electrochemical, photochemical, displacement deposition, activation by thermal decomposition of metal oxide manners, etc.). For example, and by way of example only, a non-catalytic metal silicide surface may be converted to a catalytic surface by exposure to a metal halide, for example as shown in FIG. 19. Such shows processing immediately-subsequent to that of FIG. 6 and alternate to shown by FIG. 8. A catalytic surface 79 has been formed by transformation of example upper tungsten silicide 19 to tungsten 80. Such may not cover all exposed portions of upper conductor material 17 (as shown). FIG. 20 shows subsequent electroless deposition of metal material 63 from catalytic surface 79, and FIG. 21 shows a resultant finished construction. Any other attribute(s) or aspect(s) as shown and/or described herein with respect to other embodiments may be used.

Figure 22:
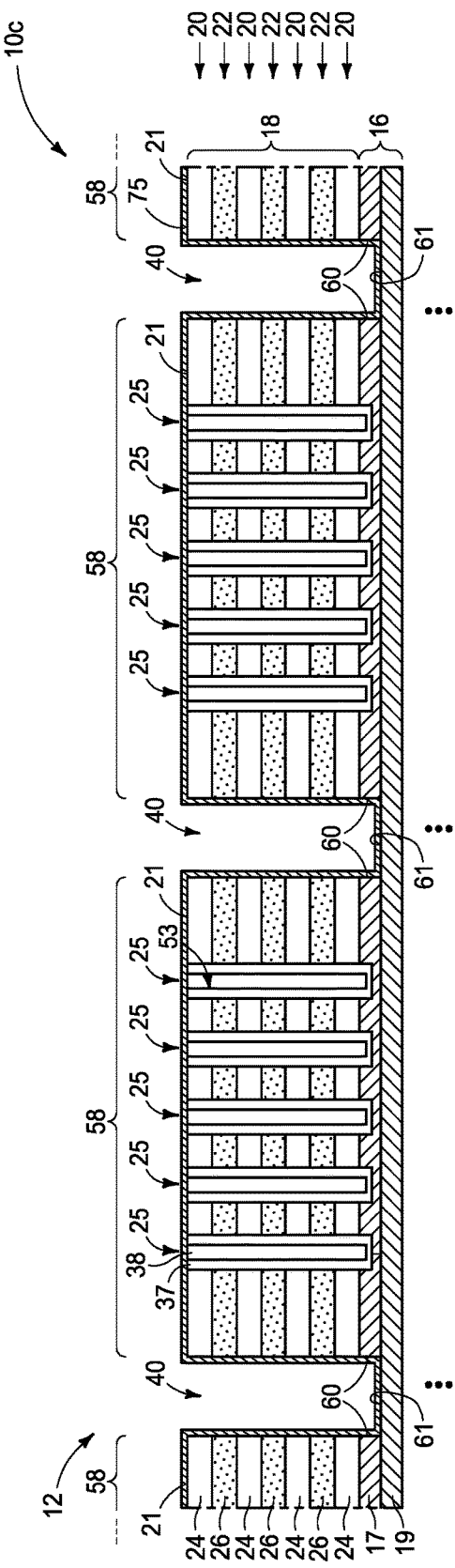
Figure 23:
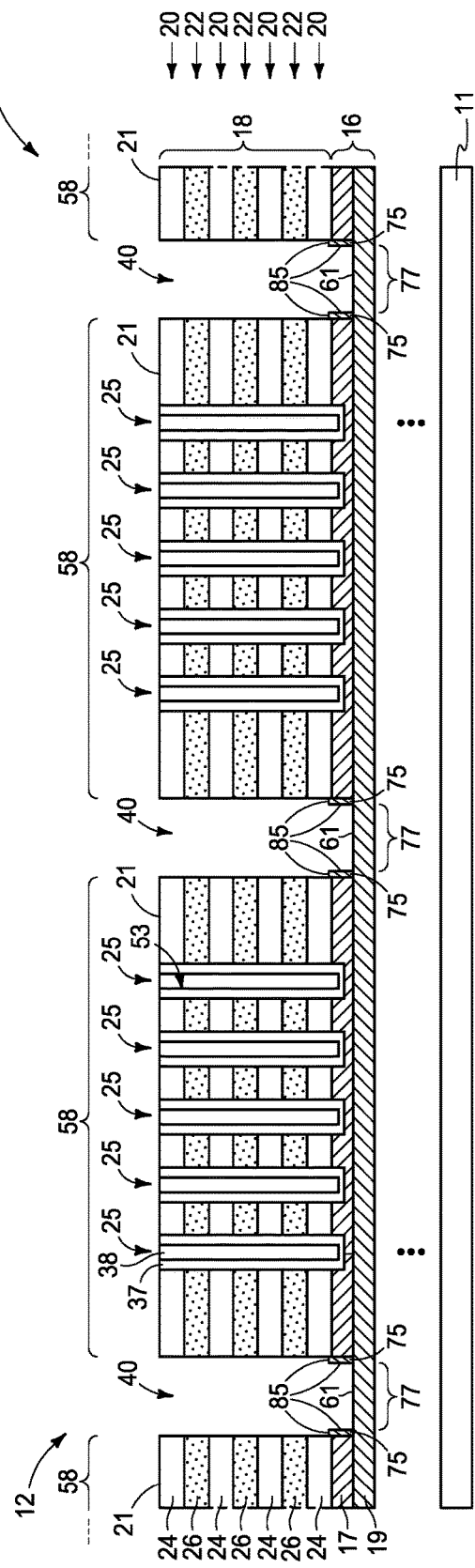

Alternately, and by way of example only, an alternate embodiment method with respect to an alternate construction 10c is described with reference to FIGS. 22-25. Like numerals from the above-described embodiments have been used where appropriate, with some construction differences being indicated with a suffix "c" or with different numerals. FIG. 22 shows depositing catalytic material 75 to line sidewalls and the bottom of individual trenches 40 and to less-than-fill individual trenches 40. FIG. 23 shows catalytic material 75 having been anisotropically etched to remove it from being over laterally-central portions 77 of individual trenches 40. Catalytic material 75 comprises a catalytic surface 85. Referring to FIGS. 24 and 25, subsequent processing has occurred whereby metal material 63 has been electrolessly deposited onto catalytic surface 85 to cover the upper conductor material and the lower conductor material within the trenches and then conducting material 48 and intervening material 57 have been formed. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

An embodiment of the invention includes a memory array (e.g., 12) comprising strings (e.g., 49) of memory cells (e.g., 56) comprising laterally-spaced memory blocks (e.g., 58) individually comprising a vertical stack (e.g., 18) comprising alternating insulative tiers (e.g., 20) and conductive tires (e.g., 22). Operative channel-material strings (e.g., 53) of the memory cells extend through the insulative tiers and the conductive tiers. A conductor tier (e.g., 16) is below the stack and comprises an upper conductor material (e.g., 17) and a lower conductor material (e.g., 19). Intervening material (e.g., 57, 63) is laterally-between and longitudinally-alongside immediately-laterally-adjacent of the memory blocks. The intervening material comprises horizontally-elongated conductor material (e.g., 63) directly electrically coupled to the conductor tier. The horizontally-elongated conductor material is of different composition from the lower conductor material, and in one embodiment of different composition from the upper conductor material. The horizontally-elongated conductor material has a top (e.g., 64) that is below a bottom (e.g., 66) of conducting material (e.g., 48) of the lowest of the conductive tiers. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing)

elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) results) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a substrate comprising a conductor tier comprising an upper conductor material and a lower conductor material, and a stack comprising vertically-alternating first tiers and second tiers above the conductor tier. Horizontally-elongated trenches are formed through the stack to the upper conductor material and the lower conductor material. At least one of the upper and lower conductor materials have an exposed catalytic surface in the trenches. Metal material is electrolessly deposited onto the catalytic surface to cover the upper conductor material and the lower conductor material within the trenches. Channel-material strings of memory cells are formed and extend through the second tiers and the first tiers.

In some embodiments, a method used in forming a memory array comprises forming a substrate comprising a conductor tier comprising an upper conductor material and a lower conductor material, and a stack comprising vertically-alternating first tiers and second tiers above the conductor tier. Horizontally-elongated trenches are formed through the stack to the upper conductor material and the lower conductor material. At least one of the upper and lower conductor materials has an exposed non-catalytic surface in the trenches. A catalytic surface is formed over the exposed non-catalytic surface in the trenches of the at least one of the upper and lower conductor materials. Metal material is electrolessly deposited onto the catalytic surface to cover the upper conductor material and the lower conductor material within the trenches. Channel-material strings of memory cells are formed and extend through the second tiers and the first tiers.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. A conductor tier is below the stack and comprises an upper conductor material and a lower conductor material. Intervening material is laterally-between and longitudinally-alongside immediately-laterally-adjacent of the memory blocks. The intervening material comprises horizontally-elongated conductor material directly electrically coupled to the conductor tier. The horizontally-elongated conductor material is of different composition from the lower conductor material. The horizontally-elongated conductor material has a top that is below a bottom of conducting material of a lowest of the conductive tiers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
   forming a substrate comprising a conductor tier comprising an upper conductor material and a lower conductor material, and a stack comprising vertically-alternating first tiers and second tiers above the conductor tier;
   forming horizontally-elongated trenches through the stack to the upper conductor material and the lower conductor material, at least one of the upper and lower conductor materials having an exposed non-catalytic surface in the trenches;
   forming a catalytic surface over the exposed non-catalytic surface in the trenches of the at least one of the upper and lower conductor materials;
   electrolessly depositing a metal material onto the catalytic surface to cover the upper conductor material and the lower conductor material within the trenches;
   forming channel-material strings of memory cells extending through the second tiers and the first tiers; and
   the forming of the catalytic surface comprising:
       depositing a catalytic material to line sidewalls and a bottom of individual of the trenches and to less-than-fill the individual trenches; and
       anisotropically etching the catalytic material to remove it from being over laterally-central portions of individual of the trenches.

2. The method of claim 1 wherein the catalytic surface comprises at least one of Ti, Ni, W, Co, Cu, Mo, Au, and Pd.

3. The method of claim 1 wherein the electrolessly depositing forms the metal material to have a top that is below a bottom of conducting material of a lowest of the first tiers.

4. The method of claim 1 wherein the electrolessly depositing forms the metal material to have a top that is above a bottom of conducting material of a lowest of the first tiers and further comprising vertically recessing the metal material after the electrolessly depositing to move said top to below said bottom.

5. The method of claim 1 wherein the first tiers comprise a sacrificial material, and further comprising:
   after the electrolessly depositing, isotropically etching away and replacing the sacrificial material that is in the first tiers with a conducting material of individual conductive lines; and
   forming an intervening material in the trenches above the metal material after the etching.

6. The method of claim 1 wherein both of the upper and lower conductor materials have the exposed non-catalytic surface.

7. The method of claim 1 wherein the lower conductor material comprises tungsten silicide and said at least one non-catalytic surface and the upper conductor material comprises conductively-doped polysilicon and another of said at least one non-catalytic surface.

8. The method of claim 7 comprising converting said non-catalytic surface comprising tungsten silicide to tungsten by exposure to a tungsten halide.

* * * * *